(12) United States Patent
Lee

(10) Patent No.: US 10,362,694 B1
(45) Date of Patent: Jul. 23, 2019

(54) ELECTRONIC DEVICE WITH ANTI-DETACHMENT STRUCTURE

(71) Applicant: NANNING FUGUI PRECISION INDUSTRIAL CO., LTD., Nanning (CN)

(72) Inventor: Chien-Hung Lee, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 0 days.

(21) Appl. No.: 15/965,822

(22) Filed: Apr. 27, 2018

(51) Int. Cl.
*H05K 5/00* (2006.01)
*H05K 5/02* (2006.01)
*H05K 5/03* (2006.01)

(52) U.S. Cl.
CPC ......... *H05K 5/0208* (2013.01); *H05K 5/0008* (2013.01); *H05K 5/0013* (2013.01); *H05K 5/0221* (2013.01); *H05K 5/0252* (2013.01); *H05K 5/03* (2013.01)

(58) Field of Classification Search
CPC .......... H05K 5/03; H05K 5/02; H05K 5/0208; H05K 5/0008; H05K 5/0221; H05K 5/0252; H02G 3/08; H02G 3/081; H02G 3/14
USPC ............ 174/50, 520, 17 R; 220/3.2, 3.3, 3.8, 220/4.02; 439/76.1, 76.2, 535, 536; 70/1, 57, 57.1, 58, 77, 78
See application file for complete search history.

(56) References Cited

U.S. PATENT DOCUMENTS

| | | | | |
|---|---|---|---|---|
| 5,197,307 A * | 3/1993 | Abbott, Jr. | ............... | H02G 3/14 52/220.1 |
| 5,212,899 A * | 5/1993 | Fandreyer | ................ | G09F 3/20 174/66 |
| 6,593,530 B2 * | 7/2003 | Hunt | ........................ | H02G 3/14 174/66 |
| 7,538,271 B2 * | 5/2009 | O'Young | ................ | H02G 3/14 174/66 |
| 8,302,796 B1 * | 11/2012 | Johnson | ................... | H02G 9/10 174/66 |
| 8,748,742 B1 * | 6/2014 | Cordova | .................. | H02G 1/00 174/37 |
| 8,835,757 B2 * | 9/2014 | Freeman | .................. | H02G 9/10 174/37 |
| 9,022,439 B2 * | 5/2015 | Ousley | ..................... | H02G 9/10 174/50 |
| 9,435,099 B2 * | 9/2016 | Dang | .................. | E02D 29/1427 |

FOREIGN PATENT DOCUMENTS

CN          200941403 Y       8/2007

* cited by examiner

*Primary Examiner* — Angel R Estrada
(74) *Attorney, Agent, or Firm* — ScienBiziP, P.C.

(57) ABSTRACT

An electronic device with anti-detachment structure includes a top cover, a bottom cover defining a sliding slot and a through hole mounted on the bottom cover, a bracket having a block mounted on the top cover, an elastic member mounted between the top cover and the bracket, and an offset member. The block is pushed by the offset member to bring the bracket locked into the sliding slot; when the top cover is separated from the bottom cover, the offset member is separated from the block, and the bracket leaves the sliding slot by an elastic resilience of the elastic member.

8 Claims, 8 Drawing Sheets

ELECTRONIC DEVICE WITH ANTI-DETACHMENT STRUCTURE

FIELD

The subject matter herein generally relates to an anti-detachment structure, and more particularly to electronic device with the same.

BACKGROUND

To prevent disassembly of electronic devices, the electronic devices may use special screws, a lock on the electronic devices, or an external anti-detachment structure. Special screws on the electronic devices needs special tools when the electronic devices in assembly and maintenance. Locks on the electronic devices have risks of breaking or lose of the key of the lock because of careless users. The external anti-detachment structure leads to overall volume increases and higher costs.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
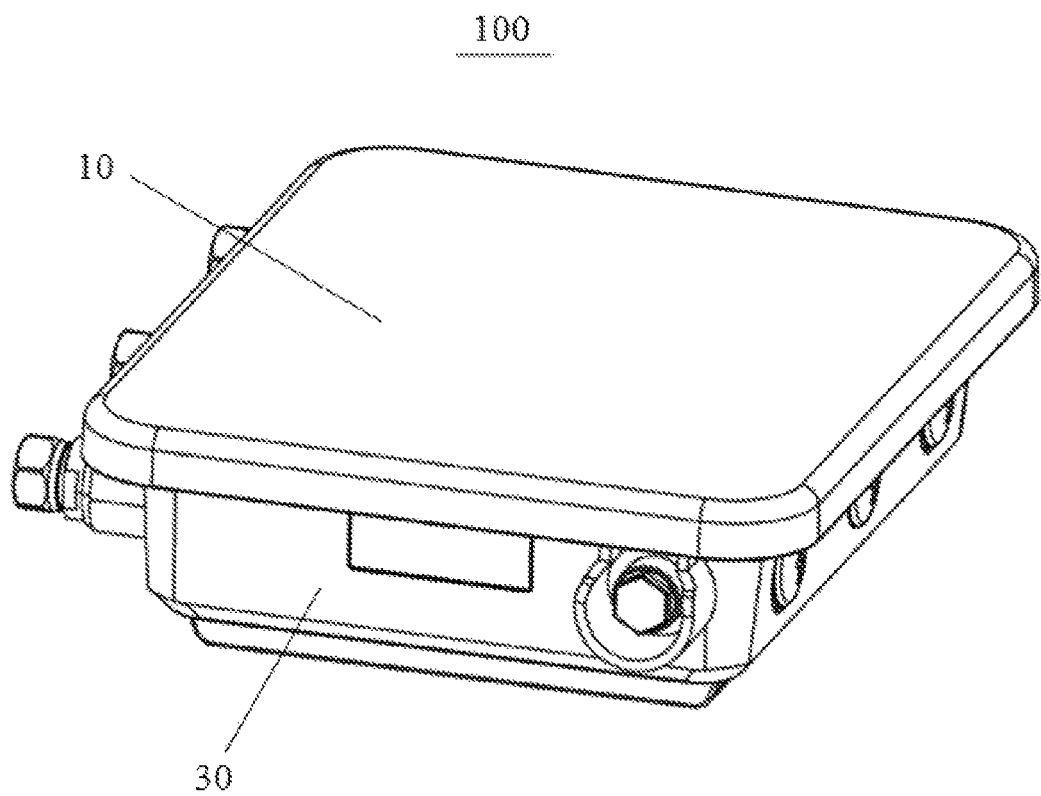
FIG. 1 is an isometric view of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of example and not by way of limitation in the figures of the accompanying drawings in which like reference numerals indicate the same or similar elements. It should be noted that references to "an" or "one" embodiment in this disclosure are not necessarily to the same embodiment, and such references can mean "at least one".

Figure 2:
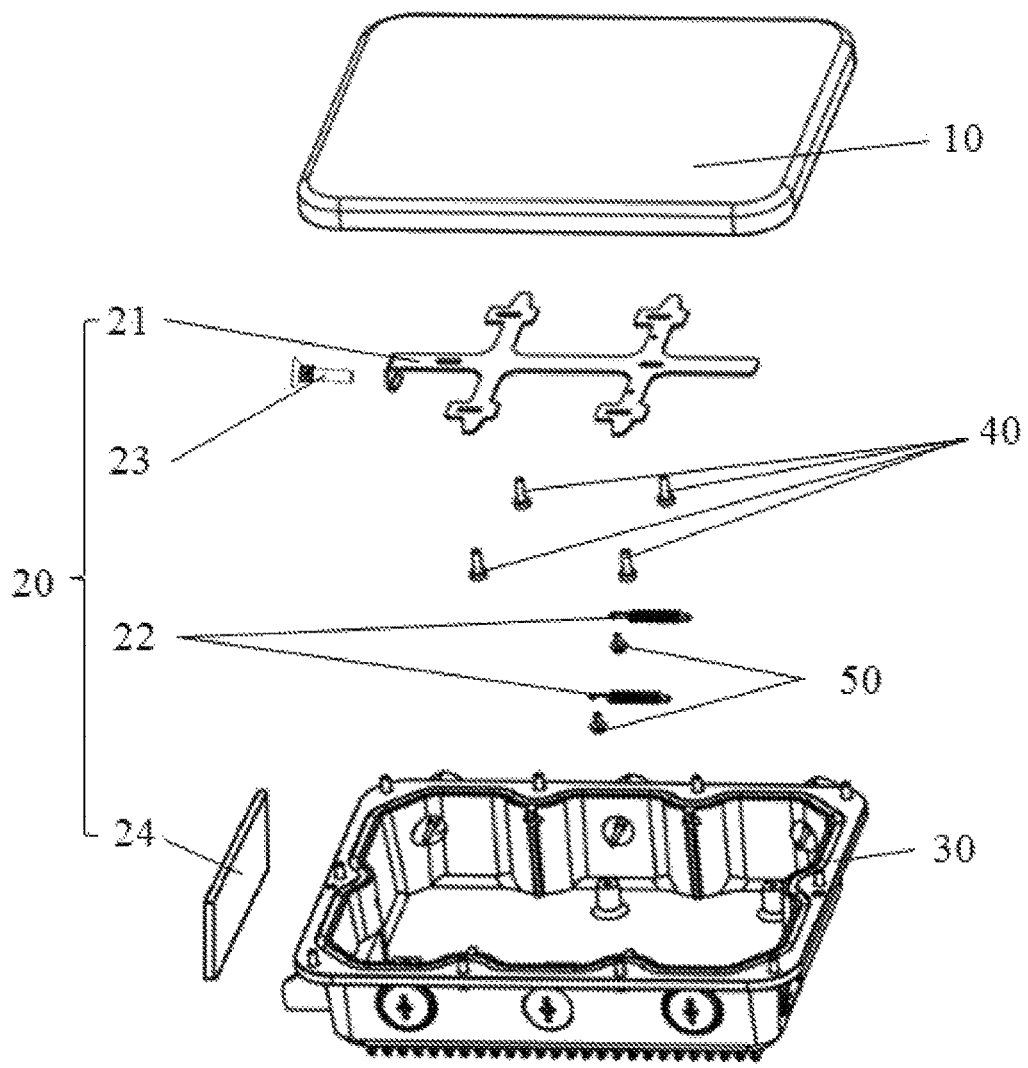
FIG. 2 is an exploded view of the electronic device shown in FIG. 1.

Referring to FIGS. 1 and 2, an embodiment of an electronic device includes a top cover 10, an anti-detachment structure 20, a bottom cover 30, a first fastener 40 and a second fastener 50. The anti-detachment structure 20 includes a bracket 21, an elastic member 22, an offset member 23 and a product identification 24. The anti-detachment structure 20 is received in a space defined by the top cover 10 and the bottom cover. The bracket 21 is mounted on the inside of the top cover 10 by the first fastener 40, and the elastic member 22 is mounted on the inside of the top cover 10 by the second fastener 50. The bracket 21 and the elastic member 22 is received in the space defined by the top cover 10 and the bottom cover. The bracket 21 is pushed by the offset member 23, and the product identification 24 is used to hide the offset member 23. In the embodiment, the elastic member 22 is a coil spring, and the offset member 23 is a flat head screw.

Figure 3:
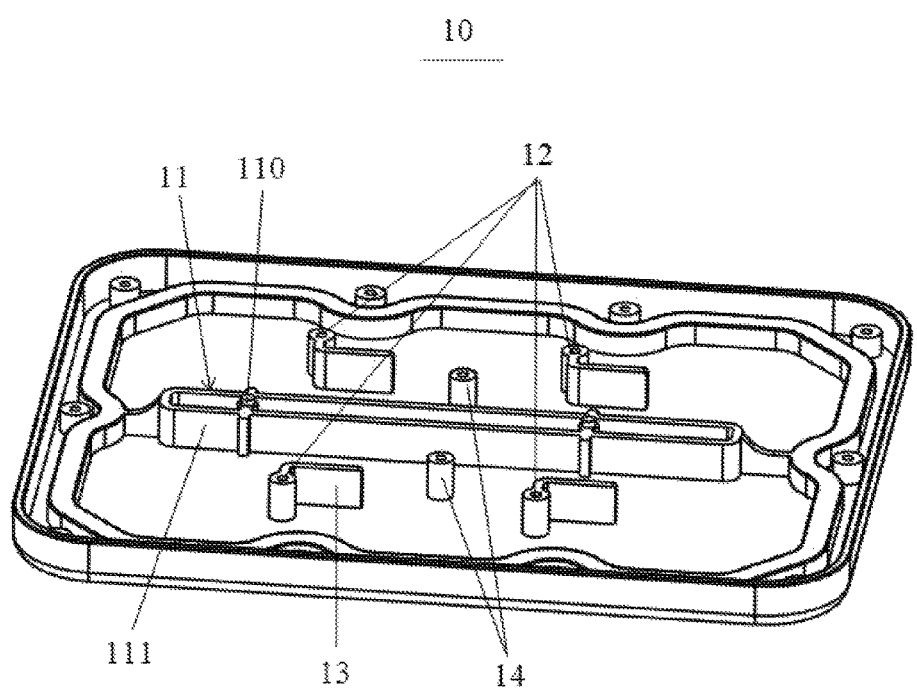
FIG. 3 is an isometric view of a top cover of the electronic device shown in FIG. 1.

Referring to FIG. 3, the top cover 10 includes a supporting rail 11, a first screw pillar 12, a supporting rib 13 and a second screw pillar 14. The supporting rail 11 has a guiding column 110. The first screw pillar 12 and the second screw pillar 14 are located on two sides of the supporting rail 11, and the supporting rib 13 is connected to the first screw pillar 12. The supporting rail 11 has two parallel side plates 111, and the guiding column 110 locates between the two side plates 111. The supporting rib 13 extends from one side of the first screw pillar 12. In an embodiment, the supporting rib 13 is L-shaped, there are four first screw pillars 12, and two second screw pillars 14. In another embodiment, there are a number of first screw pillars 12 and second screw pillars 14 different from the number of four and two, and the supporting rib 13 can be other shapes such as squares, rectangles or irregular shapes.

Figure 4:
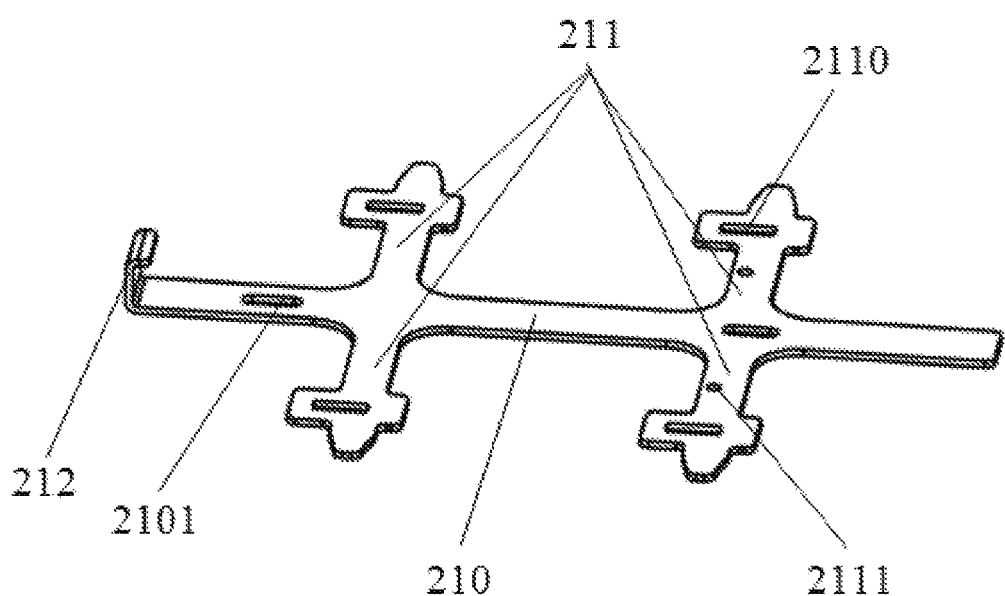
FIG. 4 is an isometric view of a bracket of the electronic device shown in FIG. 1.

Referring to FIG. 4, the bracket 21 includes a vertical portion 210 and a horizontal portion 211, the horizontal portion 211 extends from two sides of the vertical portion 210. The vertical portion 210 is perpendicular to the horizontal portion 211. The vertical portion 210 defines a first guiding hole 2101, and a block 212 is disposed on one end of the vertical portion 210. The horizontal portion 211 defines a second guiding hole 2110 and a perforation 2111. There are a plurality of horizontal portions 211 extending from two sides of the vertical portion 210. In the embodiment, the horizontal portion 211 is four, and two of the horizontal portions 211 are on a same line.

Figure 5:
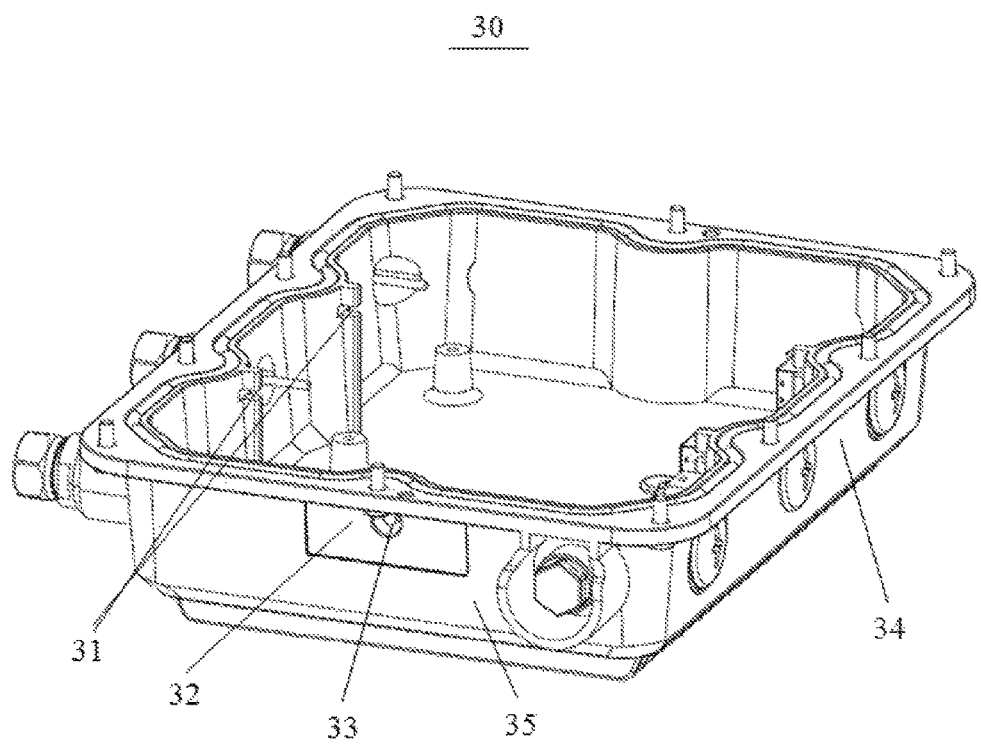
FIG. 5 is an isometric view of a bottom cover of the electronic device shown in FIG. 1.

Referring to FIG. 5, the bottom cover 30 defines a sliding slot 31, a through hole 32 and a groove 33. The sliding slot 31 is disposed on two opposite first side walls 34. The number of sliding slots 31 is consistent with the number of horizontal portions 211 of the bracket 21. The groove 33 is disposed on a second side wall 35 of the bottom cover 30. The groove 33 is in communication with the through hole 32 and penetrates the second side wall 35.

Figure 6:
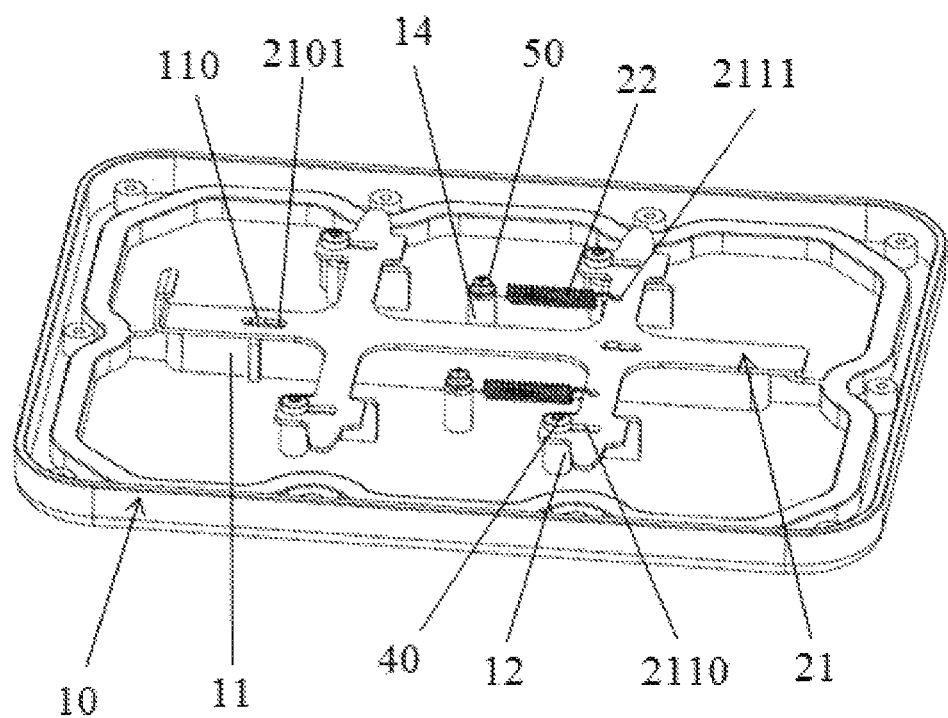
FIG. 6 is an isometric view of the top cover, the bracket and an elastic member assembled shown in FIG. 1.
Figure 7:
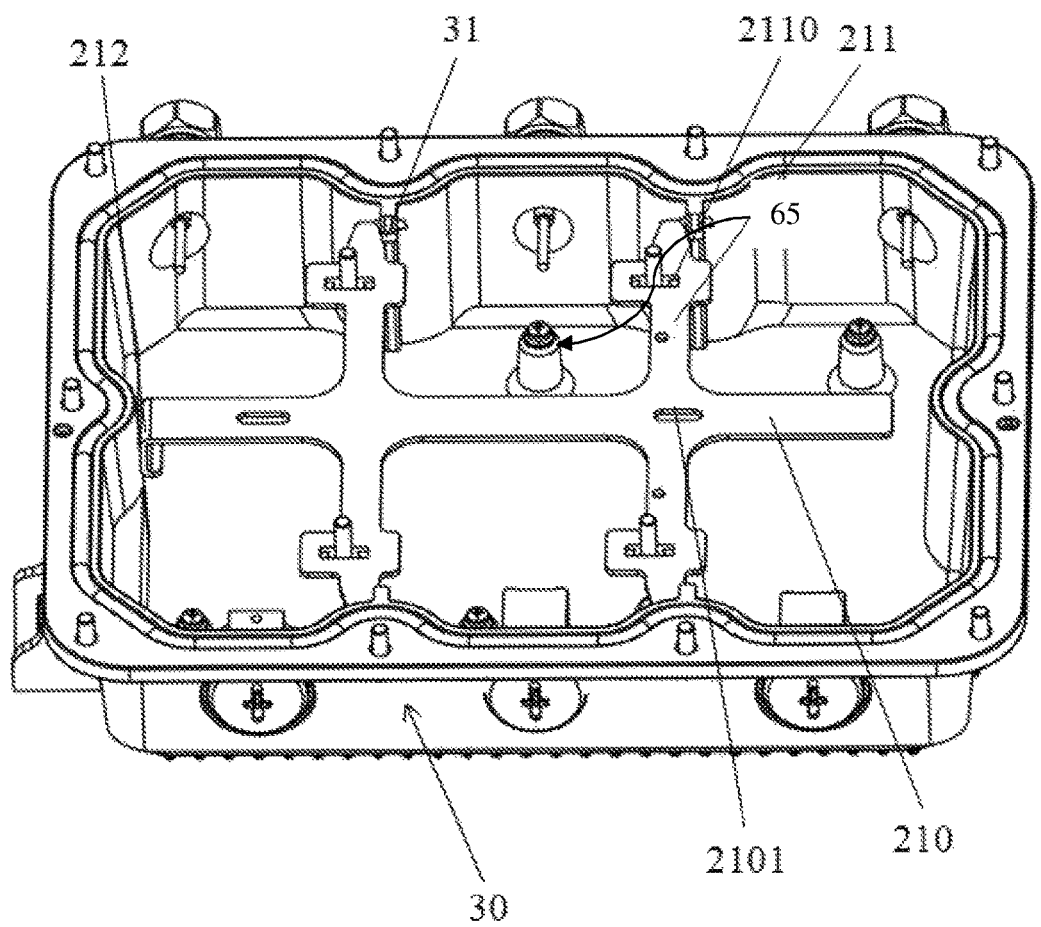
FIG. 7 is an isometric view of the bracket assembled to the bottom cover in an initial state shown in FIG. 1.
Figure 8:
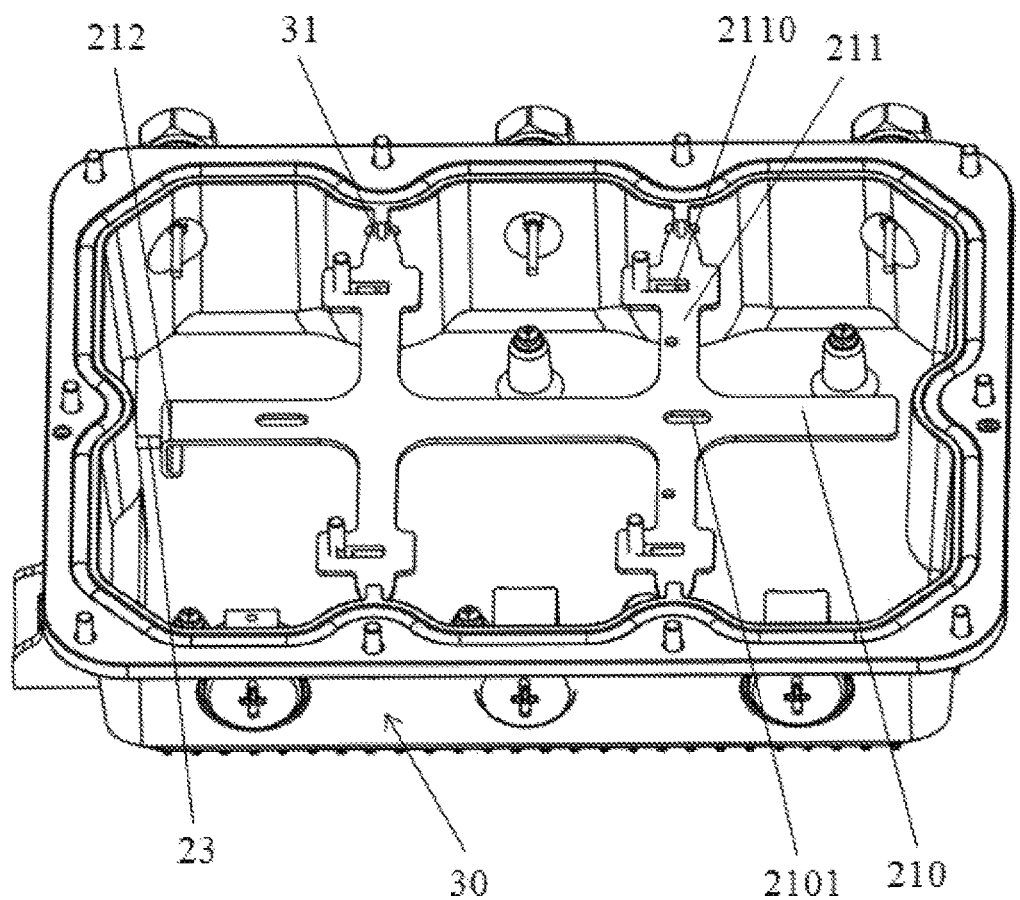
FIG. 8 is an isometric view of the bracket assembled to the bottom cover in a final state shown in FIG. 1.

FIGS. 6, 7 and 8, show the assembled electronic device 100. The bracket 21 is assembled to the top cover 10. In detail, the guiding column 110 of the supporting rail 11 enters into the first guiding hole 2101, and the second guiding hole 2110 is right to the first screw pillar 12, the first fastener 40 passes through the second guiding hole 2110 and is threadedly engaged with the first screw pillar 12, and the bracket 21 is mounted on the top cover 10.

The elastic member 22 with one end hooked on the perforation 2111 of the horizontal portion 211, and other end of the elastic member 22 is mounted on the second screw pillar 14 by the second fastener 50. At this time, the elastic member 22 is in a free stretching state without any external force. The guiding column 110 is located at one end of the first guiding hole 2101. The first fastener 40 is located at one end of the second guiding hole 2110. The top cover 10, the bracket 21 and the elastic member 22 assembled are mounted on the bottom cover 30. In this embodiment, the top cover 10 is locked with the bottom cover 30 by a screw. In other embodiment, the top cover 10 is locked with the bottom cover 30 can use other mounting ways, such as mounted by a fastener or a buckle.

The top cover 10 is mounted on the bottom cover 30, the horizontal portion 211 of the bracket 211 is located on one side of the sliding slot 31, and the block 212 extended from the vertical portion 210 is right to the through hole 32 of the bottom cover 30. The offset member 23 enters into the through hole 32 and is threadely engaged with the through hole 32. The offset member 23 is rotated to push the block 212 to bring the bracket 21 movement along with the first guiding hole 2101 and the second guiding hole 2110. Then, the horizontal portion 211 enters into the sliding slot 31 and is locked, and the elastic member 22 is pressed and compressed. Finally, the product identification 24 is embedded into the groove 33 of the bottom cover 30. Since the product identification 24 is filled with the groove 33 and covers the offset member 23, the offset member 23 is hidden by the product identification 24, and finished assembling of the electronic device 100.

When the electronic device 100 disassembled, the product identification 24 is removed from the bottom cover 30, the offset member 23 is rotated to disconnect the through hole 32, the block 212 is separated from the offset 23, and the block 212 is not worked by the offset member 23. The bracket 21 is subjected to an elastic resilience of the elastic member 22, and the bracket 21 moves along with the first guiding hole 2101 and the second guiding hole 2110, and finally the horizontal portion 211 leaves the sliding slot 31, then open the top cover 10 from the bottom cover 30.

When the electronic device 100 is disassembled illegally, users are only removing the top cover 10 from the bottom cover 30. Because the bracket 21 and the sliding slot 31 in the anti-detachment structure 20 are not known, the electronic device 100 is still impossible or at least very difficult to disassemble. The product identification 24 effectively hides the offset member 23 inside the electronic device 100, and the disassembling way of the anti-detachment structure 20 is concealed. Illegal users can not disassemble the electronic device 100, thus protecting the electronic device 100 and avoiding the risk of disassembling.

This anti-detachment structure can hide the detachment principle so users can not easily detect the hidden function of the electronic device or disassemble the electronic device. Product identification 24 is embedded into the groove 33 of the bottom cover 30 for waterproofing the electronic device. As the anti-detachment structure 20 is hidden inside the electronic device, the electronic device has a better aesthetic appeal. There is no need to design an external disassemble structure, so the overall volume of the electronic device is not unreasonable. Also the anti-detachment structure inside the electronic device avoids corrosion and reduces cost.

The embodiments shown and described above are only examples. Many details are often found in the art such as the features of electronic device with anti-detachment structure. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An electronic device with anti-detachment structure, comprising:
    a bottom defining a sliding slot and a through hole;
    a top cover mounted on the bottom cover;
    a bracket mounted on the top cover, the bracket having a block;
    an elastic member mounted between the top cover and the bracket; and
    an offset member; wherein the block is pushed by the offset member to lock the bracket in the sliding slot, compressing the elastic member, and when the top cover is separated from the bottom cover, the offset member is separated from the block and the bracket leaves the sliding slot by an elastic resilience of the elastic member,
    wherein the top cover comprises a supporting rail, a first screw pillar, a supporting rib and a second screw pillar, the supporting rail has a guiding column, the first screw pillar and the second screw pillar are located on opposite sides of the supporting rail, and the supporting rib is connected with the first screw pillar.

2. The electronic device with anti-detachment structure of claim 1, further comprising a product identification, wherein the bottom cover further comprises a groove in communication with the through hole, and the product identification is embedded into the groove to hide the offset member.

3. The electronic device with anti-detachment structure of claim 1, wherein the bracket comprises a vertical portion and a horizontal portion, the horizontal portion extending from two sides of the vertical portion, the vertical portion is perpendicular to the horizontal portion, the block is on one end of the vertical portion, the vertical portion defines a first guiding hole, and the horizontal portion defines a second guiding hole and a perforation.

4. The electronic device with anti-detachment structure of claim 1, further comprising a first fastener and a second fastener, wherein the bracket is mounted on the first screw pillar by the first fastener, and the elastic member is mounted on the second screw pillar by the second fastener.

5. The electronic device with anti-detachment structure of claim 3, wherein the guiding column passes through first guiding hole, the first fastener passes through the second guiding hole, and the bracket moves along the first guiding hole and the second guiding hole.

6. The electronic device with anti-detachment structure of claim 3, wherein the elastic member is mounted on the bracket through the perforation.

7. The electronic device with anti-detachment structure of claim 1, wherein the supporting rail is used for supporting the vertical portion, and the supporting rib is used for supporting the horizontal portion.

8. The electronic device with anti-detachment structure of claim 7, wherein the offset member is threadedly engaged with the through hole.

\* \* \* \* \*